United States Patent [19]

Danner

[11] Patent Number: 5,081,633
[45] Date of Patent: Jan. 14, 1992

[54] SEMICONDUCTOR LASER DIODE

[75] Inventor: Allan D. Danner, Pasadena, Calif.

[73] Assignee: Applied Solar Energy Corporation, City of Industry, Calif.

[21] Appl. No.: 531,511

[22] Filed: May 31, 1990

[51] Int. Cl.[5] .............................................. H01S 3/19
[52] U.S. Cl. ........................................ 372/45; 357/16; 357/17; 372/46
[58] Field of Search .................. 372/45, 46, 8; 357/16, 357/17

[56] References Cited

U.S. PATENT DOCUMENTS

| | | | |
|---|---|---|---|
| 3,982,207 | 9/1976 | DIngle et al. | 331/94.5 |
| 4,136,928 | 1/1979 | Logan et al. | 350/96.11 |
| 4,483,004 | 11/1984 | Inaba et al. | 372/8 |
| 4,599,728 | 7/1986 | Alavi et al. | 372/45 |
| 4,675,518 | 6/1987 | Oimura et al. | 372/8 |
| 4,677,629 | 6/1987 | Leah | 372/18 |
| 4,692,207 | 9/1987 | Bouadma et al. | 156/649 |
| 4,700,353 | 10/1987 | Van Gieson et al. | 372/26 |
| 4,706,255 | 11/1987 | Thornton et al. | 372/50 |
| 4,731,338 | 3/1988 | Ralston et al. | 437/22 |
| 4,731,789 | 3/1988 | Thornton | 372/45 |
| 4,733,073 | 9/1988 | Warner et al. | 372/25 |
| 4,736,231 | 4/1988 | Ayabe et al. | 357/19 |
| 4,772,924 | 9/1988 | Bean et al. | 357/4 |
| 4,803,537 | 2/1988 | Lewis et al. | 357/30 |
| 4,803,696 | 2/1989 | Pepper et al. | 372/95 |
| 4,805,178 | 2/1989 | Wilt | 372/46 |
| 4,839,899 | 6/1989 | Burnham et al. | 372/45 |
| 5,001,522 | 3/1991 | Takahashi et al. | 372/45 |

*Primary Examiner*—James W. Davie
*Attorney, Agent, or Firm*—Poms, Smith, Lande & Rose

[57] ABSTRACT

A semiconductor laser diode has a short period substantially intrinsic superlattice structure. The superlattice is constructed from alternating layers of substantially intrinsic direct and indirect semiconductor material. Semiconductor electrodes, one being p-type and the other being n-type, are each formed adjacent a respective opposite lateral surface of the superlattice. The electrodes are biased to inject carriers into the superlattice. At the top and bottom surfaces of the superlattice, a semiconductor layer is formed, one layer being n-type and the other being p-type. These layers are biased by an intermittent voltage to develop an intermittent field across the superlattice. This field transforms the indirect material to direct material. The recombination of carriers in the quantum well when the material becomes direct develops optical radiation to be emitted.

44 Claims, 3 Drawing Sheets

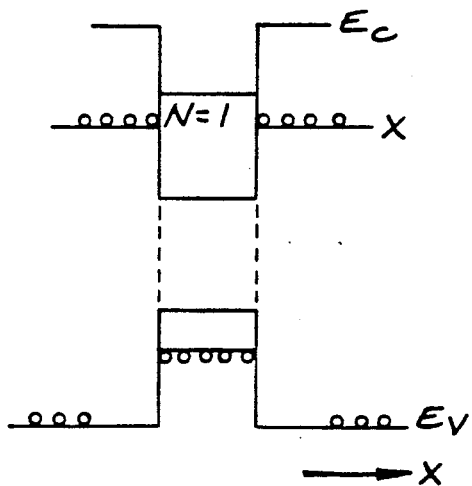
FIG. 2A
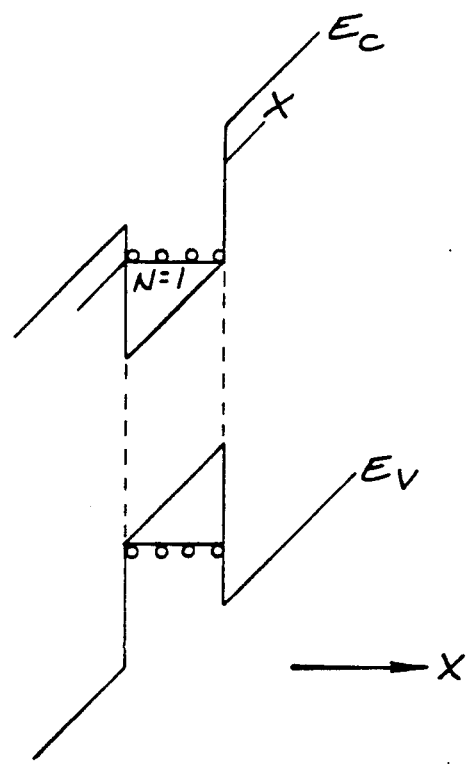
FIG. 2B
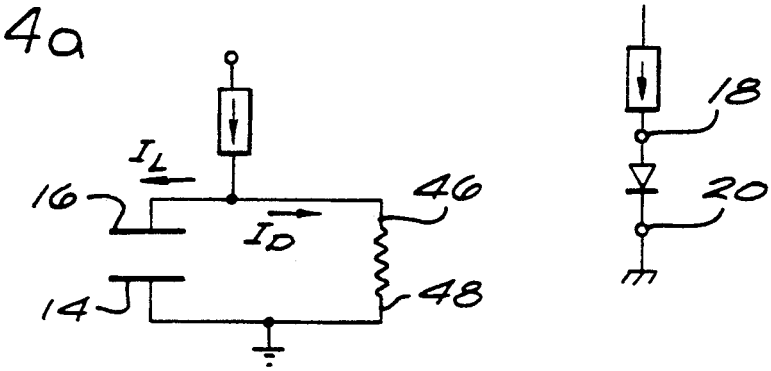
FIG. 4a
FIG. 4b

5,081,633

SEMICONDUCTOR LASER DIODE

FIELD OF THE INVENTION

The present invention relates generally to semiconductor laser diodes and more particularly to a semiconductor laser diode having a short period substantially intrinsic superlattice formed from alternating layers of direct and indirect semiconductor material.

BACKGROUND OF THE INVENTION

It is known that active modulation of quantum layers by energy shifts and gain spectra is possible by applying the electric field across the quantum wells. For example, see Van Gleson, U.S. Pat. No. 4,700,353. Modulation of the semiconductor laser device is achieved at microwave frequencies by the application of transverse fields which produce energy shifts in the gain spectra of the laser diode. As described in the '353 patent, the laser device is a pn diode which has a body portion constructed from a non-conductive material, with p- and n-type implants on opposite sides. The p and n implants define a transition region, or layer, on the order of one micron in width, in which is formed a quantum well having a thickness on the order of 50 to 100 angstroms. Application of a bias voltage across the pn junction provides lasing of the device. An electrode on the surface of the transition layer allows application of a transverse electric field to the pn junction. This transverse field quenches the lasing of the device, to provide modulation of the laser.

The active region of the device disclosed in the '353 patent exhibits a change in gain characteristics due to the effects associated with quantum confined Stark effect. Essentially, an electric field applied across a quantum well spatially separates (in real space) the carrier, such that the overlap integral of the carrier wave functions and thus the optical gain is reduced. A significant disadvantage and limitation of the device described in the '353 patent is that only short pulses of energy can be extracted due to the short carrier lifetimes and small carrier populations.

SUMMARY OF THE INVENTION

According to the present invention, the semiconductor laser diode includes a short period substantially intrinsic superlattice having a top surface, a bottom surface, a first side and a second side opposite the first side. A first semiconductor layer of a first conductivity type is coextensively disposed on the top surface and a second semiconductor layer of a second conductivity type opposite the first type is coextensively disposed on the bottom surface. A first semiconductor electrode of a first conductivity type is coextensively disposed on the first side and a second semiconductor electrode of a second conductivity type is coextensively disposed on the second side. The first electrode and the second electrode are adapted to be biased by a first voltage to inject carriers into the superlattice. The first layer and the second layer are adapted to have a second voltage intermittently applied thereto to develop an intermittent electric field across the lattice. The intermittent electric field changes the conduction band nearest the quasi-Fermi level between one which is direct to one which is indirect in both real and momentum space.

When the active region is biased such that the carriers are indirect in momentum and real space, the carrier lifetime will be many orders of magnitude greater than that found in a system which is just spatially indirect. Substantially greater carrier populations can be obtained when the active region is indirect in both real and momentum space. Therefore, large pulses of energy can be extracted when the active region is switched to direct in real and momentum space. This is important in Q-switching applications. Also, the injected current density necessary to invert the population between the pulses will be substantially reduced.

These and other objects, advantages and features of the present invention will become readily apparent to those skilled in the art from a study of the following description of an exemplary preferred embodiment when read in conjunction with the attached drawings and appended claims.

BRIEF DESCRIPTION OF THE DRAWINGS

FIGS. 2a and 2b are energy diagrams illustrating the transformation from direct to indirect material under the application of an electric field;

FIGS. 4a and 4b are equivalent circuit diagrams of the device shown in FIG. 3.

DESCRIPTION OF AN EXEMPLARY PREFERRED EMBODIMENT

Figure 1:
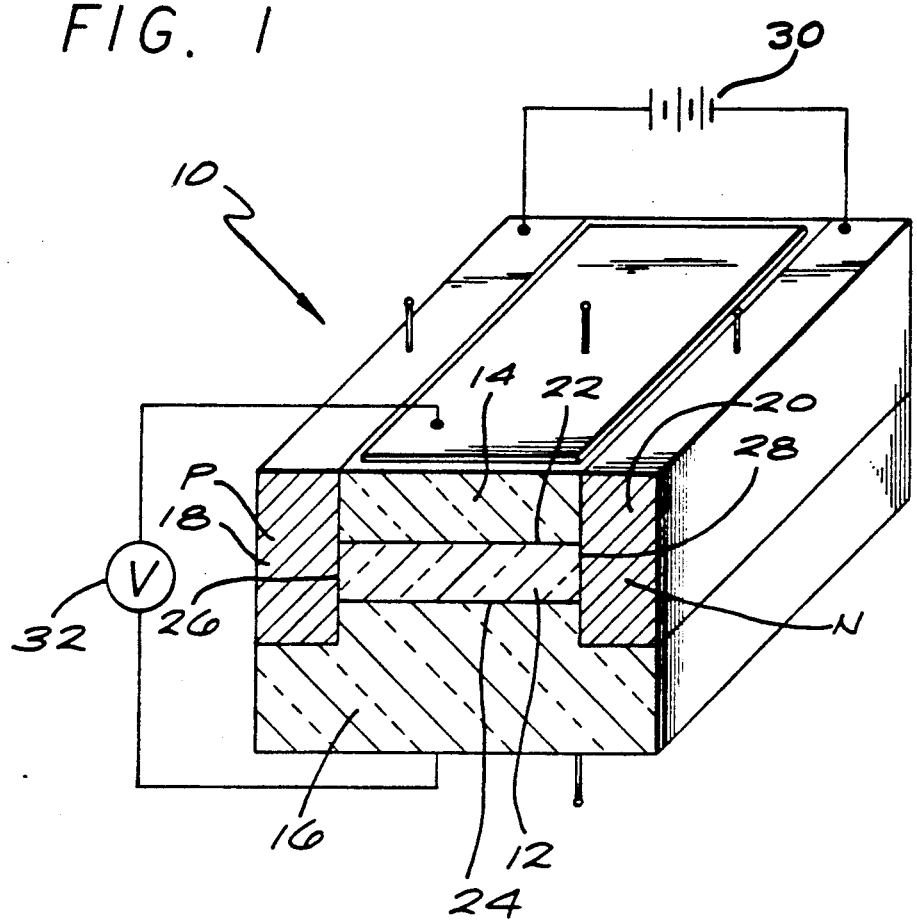
FIG. 1 illustrates, in cross-section, a novel semiconductor laser diode constructed according to the principles of the present invention.

Referring now to FIG. 1, there is shown a semiconductor laser diode 10 constructed according to the principles of the present invention. The laser diode 10 includes a short period substantially intrinsic superlattice 12, a first semiconductor layer 14, a second semiconductor layer 16, a first semiconductor electrode 18, and a second semiconductor electrode 20.

The superlattice 12 has a top surface 22, a bottom surface 24, a first side 26 and a second side 28. The first semiconductor layer 14 is of a first conductivity type and is coextensively disposed on the top surface 22. The second semiconductor layer 16 is of a second conductivity type opposite the first conductivity type and is coextensively disposed on the bottom surface 24. The first semiconductor electrode 18 is of the first conductivity type and is further coextensively disposed on the first side 26. The second semiconductor electrode 20 is of the second conductivity type and is coextensively disposed on the second side 28.

The first electrode 18 and the second electrode 20 are adapted to be biased by a first voltage to inject carriers into the superlattice 12. As best seen in FIG. 1, an external voltage source 30 applies the voltage to the first electrode 18 and the second electrode 20.

The first layer 14 and the second layer 16 are adapted to have a second voltage intermittently applied thereto to develop an intermittent electric field transverse to the lattice. An external switched voltage source 32 may apply a voltage to the first layer 14 and second layer 16 to develop the intermittent electric field. In the embodiment shown in FIG. 1, the first conductivity type is p-type and the second conductivity type is n-type. Each of the first semiconductor layer 14 and the second semiconductor layer 16 may be formed from a lightly doped large band-gap semiconductor material. Similarly, each of the first semiconductor electrode and the second semiconductor electrode 20 may be formed from a moderately doped large band-gap semiconductor material. The second layer 16 further extends beneath the first electrode 18 and the second electrode 20. The first electrode 18 and the second electrode 20 extend laterally along the edges of the first layer 14.

The superlattice 12 is formed from alternating layers of a first semiconductor material and a second semiconductor material. The first material and the second material are selected so that a conduction band and a valence band across the layers form a quantum well in the first material and an X valley in the second material, as best seen in FIG. 2a. The layers of the first material have a thickness selected such that $n=1$ level in the quantum well has a higher energy than the X valley. As best seen in FIG. 2b, when an external electric field is applied such as by switched voltage source 32, the $n=1$ level in the quantum well has a lower energy than the X valley. The first material used for the quantum wells is an indirect material and the second material used for the barriers is a direct material. Under the presence of the electric field, the indirect material is transformed to a direct material. Both of the direct and indirect material are substantially intrinsic.

More specifically, the superlattice 12 is transformed from a system from one in which the electron hole pairs occupy the same position in momentum and real space (direct) to a system in which the electrons and holes occupy different regions in momentum and real space (indirect). The ground state of the quantum wells ($n=1$) is designed to be higher than the energy level associated with the X valley in the barrier when there is no electric field across the superlattice. The dominant recombination path couples the electrons in the X valley with the holes in the well. This process is indirect in both real and momentum space. Upon application of the electric field, the energy of the $n=1$ level decreases. In a properly designed superlattice, the energy of the $n=1$ state will shift to an energy less than the energy associated with the X level in the barrier. Under these conditions, the dominant recombination (radiative) path couples electrons in the quantum well with the holes in the quantum well. Under the influence of the electric field, the superlattice can be considered direct in both real and momentum space. The thickness of the first semiconductor and second semiconductor material is selected to achieve the immediately hereinabove described energy levels.

In the device described in conjunction with FIG. 1, the use of the external electric field to switch the gain medium allows the radiative recombination efficiency to vary many orders of magnitude with the application of a modest external electric field. The first layer 14 and second layer 16 surrounding the superlattice 12 forms a p-i-n-type region to define the optical wave guide. A current injection into the active region is provided by the surrounding lateral p and n regions of the first electrode 18 and second electrode 20, respectively. The laterally doped electrodes may be formed through dopant diffusion, regrowth or implantation.

The advantages of the structure of FIG. 1 include that the power required to modulate the laser through gain switching would be substantially less than that required through direct modulation of the injection current in conventional structures. This feature reduces the support circuit complexity for integrated electro-optic circuit applications. Furthermore, the structure of FIG. 1 is well suited for Q-switch operation when there is no field across the superlattice. The carrier lifetimes would be very long because of the low rate of recombination in the indirect material. Large excess carrier densities can build up in the active region. Upon application of an external electric field, the gain medium will transform into a direct material and allow the inverted population to produce a giant pulse. This approach may produce larger pulse amplitudes, elimination of the need for an external cavity, and high overall power efficiency. The structure of the laser diode 10 could also be applied to virtually all combination of direct and indirect semiconductor material in the short period superlattice region. A typical thickness for the direct layer would be less than that needed for the elastic strain relief. It may be necessary to reduce the operating temperature so that the product kT is less than the difference in the energy level of the $n=1$ state with and without the influence of the external electric field.

Figure 3:
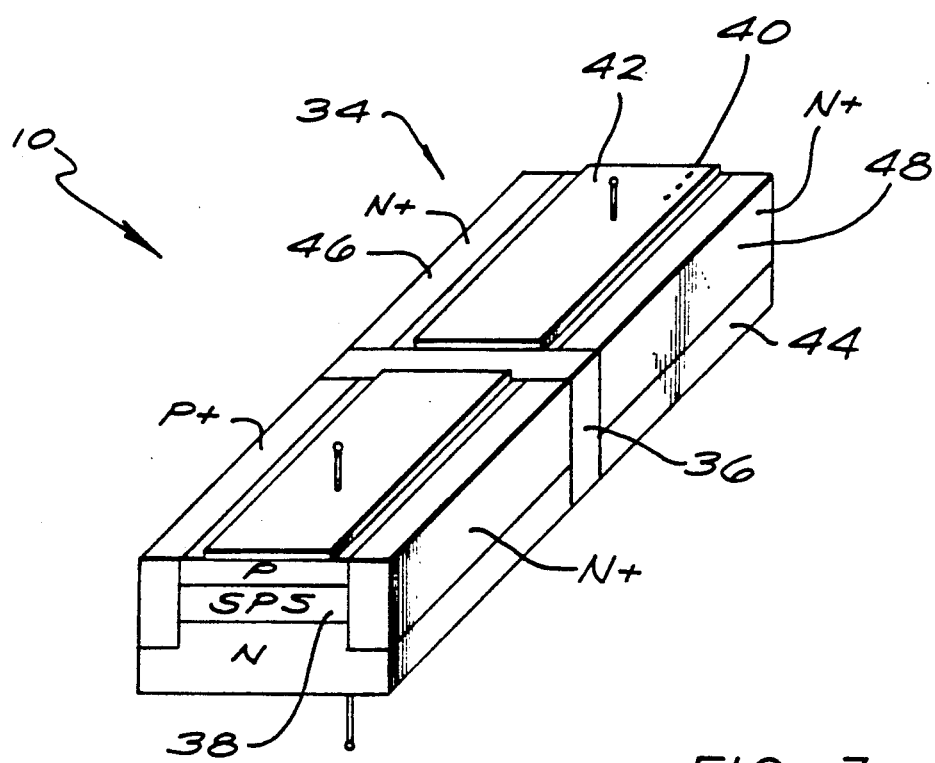
FIG. 3 illustrates an application of the device shown in FIG. 1.

With reference now to FIG. 3, an extension for the structure of the device of FIG. 1 incorporates a photoconductive diode 34 within the cavity of the laser of the device 10, which is defined by the superlattice 12. The super-lattice 12 extends through the laser diode 10 and the photo-diode 34. The regions, hereinbelow described, adjacent the superlattice 12 within the photodiode 34 are all electrically isolated from the adjacent regions of the laser diode 10 by an isolation region 36 which separates the two devices. Therefore, a first region 38 of the superlattice 12 exists within the laser diode 10 and a second region 40 of the superlattice 12 exists within the photodiode 34. The above described first layer 14, second layer 6, first electrode 18 and second electrode 20 are adjacent the first region 38. Accordingly, the first semiconductor layer is disposed adjacent a first portion of the top surface 22, the second semiconductor layer is disposed adjacent a first portion of the bottom surface 24, the first semiconductor electrode is disposed adjacent a first portion of the first side 26, and the second semiconductor electrode is disposed adjacent a second portion of the second side 28, each of these portions being coextensive with the first region 38 of the superlattice 12.

To form the photodiode 34, a third semiconductor layer 42 is disposed adjacent a second portion of the top surface 22, the third layer 42 being electrically isolated from the first layer 14. A fourth semiconductor layer 44 of the second conductivity type is disposed adjacent a second portion of the bottom surface 24. The second portion of the bottom surface 24 is opposite the second portion of the top surface 22. The fourth layer 44 is electrically isolated from the second layer 16. A third semiconductor electrode 46 of either the first conductivity type or the second conductivity type is disposed adjacent a second portion of the first side 26. The second portion of the first side 26 is generally between the second portion of the top surface 22 and the second portion of the bottom surface 24, all adjacent the second region 40 of the superlattice 12. The third electrode 46 is electrically isolated from the first electrode 18. Finally, a forth semiconductor electrode 48 of an identical conductivity type to the third electrode 46 is disposed adjacent a second portion of the second side 28. The second portion of the second side is opposite the second portion of the first side 26. The fourth electrode 48 is electrically isolated from the second electrode 20.

As described hereinabove, the first electrode 18 and the second electrode 20 are adapted to be biased by a first voltage to inject carriers into the first region 38 of the lattice 12. The first layer 14 and the second layer 16 are adapted at a second voltage intermittently applied thereto to develop an intermittent electric field across the first region 38 of the lattice 12. The third electrode 46 and the fourth electrode 48 are adapted to have a second voltage intermittently applied thereto to pump the photodiode. The third layer 42 and the fourth layer 44 are adapted to be biased by a third voltage to develop a constant electric field across the second region 40 the lattice 12. An equivalent circuit diagram showing the reference numerals for each of the layers and electrodes hereinabove described is shown in FIGS. 4a-4b.

Figure 5A:
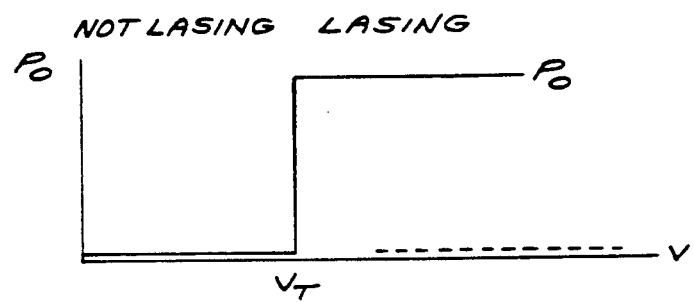
FIGS. 5a, 5b, 5c and 5d illustrate the operation of the device of FIG. 3.
Figure 5B:
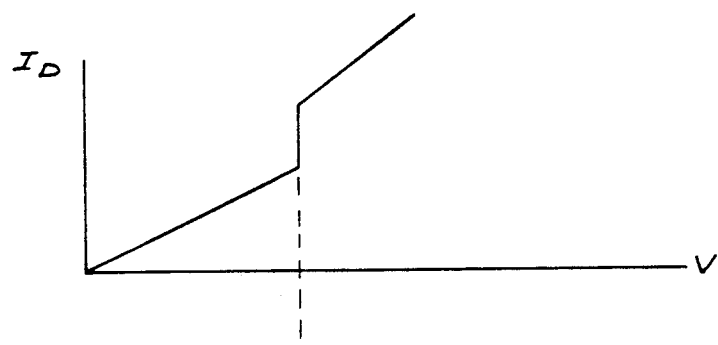
Figure 5C:
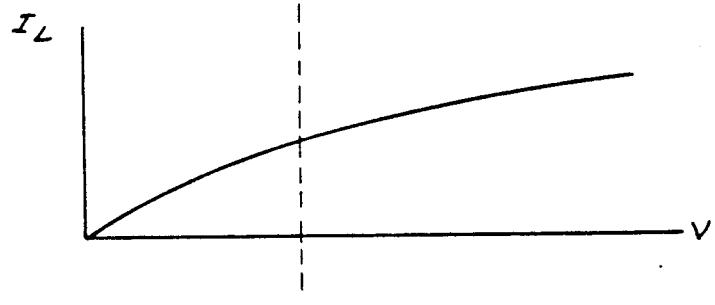
Figure 5D:
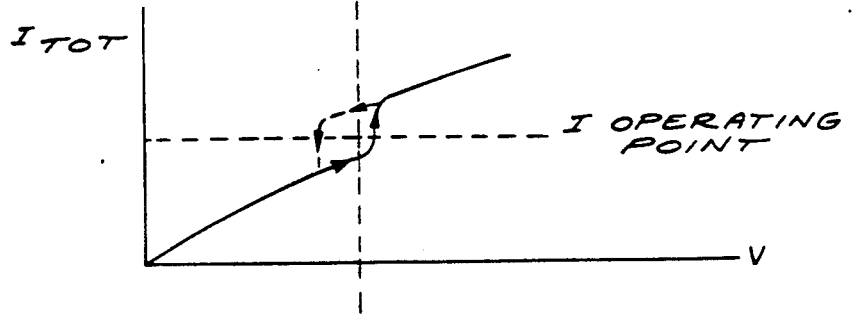

With further reference to FIGS. 5a-5d, there is shown a voltage V which is a threshold voltage defined as the voltage which the material in the superlattice transforms from indirect to direct material. As seen in FIG. 5a, the optical power out of the laser is substantially zero, or not lasing, when the applied voltage is less than $V_T$ and is lasing when the applied voltage is greater than $V_T$. The current to the photodiode 34, FIG. 5b, increases when the laser 10 is lasing because of photogenerated carriers within the photodiode which decrease the resistance of the device. FIG. 5c is the IV characteristic of the reverse biased laser 10. The total current, the sum of the detector current and the laser current, FIG. 5d, shows a hysteresis about the operating voltage $V_1$. When the operating point of the device shown in FIG. 3 is maintained within the hysteresis, an optical oscillator is achieved. When the operating point is maintained outside the hysteresis, a bistable optical switch may be achieved.

There has been described hereinabove a novel semiconductor laser device constructed according to the principles of the present invention. Those skilled in the art may now make numerous uses of and departures from the above described exemplary preferred embodiment of the present invention without departing from the inventive concepts disclosed herein. Accordingly, the present invention is to be defined solely by the scope of the following claims.

I claim:

1. A semiconductor laser diode comprising:
   a short period substantially intrinsic superlattice having a top surface, a bottom surface, a first side and a second side opposite said first side;
   a first semiconductor layer of a first conductivity type coextensively disposed on said top surface;
   a second semiconductor layer of a second conductivity type opposite said first conductivity type coextensively disposed on said bottom surface;
   a first semiconductor electrode of said first conductivity type coextensively disposed on said first side; and
   a second semiconductor electrode of said second conductivity type coextensively disposed on said second side, said first electrode and said second electrode being biased by a first voltage to inject carriers into said superlattice, said first layer and said second layer having a second voltage intermittently applied thereto to develop an intermittent electric field across said superlattice.

2. A semiconductor laser diode as set forth in claim wherein said superlattice includes alternating layers of a first semiconductor material and a second semiconductor material, said first material and said second material being selected so that a conduction band and a valence band across said layers form a quantum well in said first material and an X valley in said second material, said layers of said first material having a thickness selected such that an $n=1$ level of said quantum well has a higher energy than said X valley in the absence of said electric field and a lower energy than said X valley in the presence of said electric field.

3. A semiconductor laser diode as set forth in claim 2 wherein said first material is an indirect material and said second material is a direct material, said indirect material forming said quantum wells.

4. A semiconductor laser diode as set forth in claim 1 wherein said first conductivity type is p-type and said second conductivity type is n-type.

5. A semiconductor laser diode as set forth in claim 1 wherein each of said first semiconductor layer and said second semiconductor layer is a lightly doped large band-gap semiconductor material.

6. A semiconductor laser diode as set forth in claim 1 wherein each of said first semiconductor electrode and said second semiconductor electrode is a moderately doped large band-gap semiconductor material.

7. A semiconductor laser diode as set forth in claim 1 wherein said second semiconductor layer further extends coextensively beneath each of said first electrode and said second electrode.

8. An optical oscillator comprising:
   a short period substantially intrinsic superlattice having a top surface, a bottom surface, a first side and second side;
   a first semiconductor layer of a first conductivity type disposed adjacent a first portion of said top surface;
   a second semiconductor layer of a second conductivity type disposed adjacent a first portion of said bottom surface, said first portion of said bottom surface being opposite said first portion of said top surface;
   a third semiconductor layer of said first conductivity type disposed adjacent a second portion of said top surface, said third layer being electrically isolated from said first layer;
   a fourth semiconductor layer of said second conductivity type disposed adjacent a second portion of said bottom surface, said second portion of said bottom surface being opposite said second portion of said top surface, said fourth layer being electrically isolated from said second layer;
   a first semiconductor electrode of said first conductivity type disposed adjacent a first portion of said first side, said first portion of said first side being generally between said first portion of said top surface and said first portion of said bottom surface;
   a second semiconductor electrode of said second conductivity type disposed adjacent a first portion of said second side, said first portion of said second side being opposite said first portion of said first side;
   a third semiconductor electrode of one of said first conductivity type and said second conductivity type disposed adjacent a second portion of said first side, said second portion of said first side being generally between said second portion of said top surface and said second portion of said bottom surface, said third electrode being electrically isolated from said first electrode; and
   a fourth semiconductor electrode of an identical conductivity type as said third electrode, disposed adjacent a second portion of said second side, said second portion of said second side being opposite said second portion of said first side, said fourth electrode being electrically isolated from said second electrode;

said first electrode and said second electrode being biased by a first voltage to inject carriers into a first region of said superlattice;

said first layer and said second layer having a second voltage intermittently applied thereto to develop an intermittent electric field across said first region of said superlattice;

said third electrode and said fourth electrode having said second voltage intermittently applied thereto; and said third layer and said fourth layer being biased by a third voltage to develop a constant electric field across a second region of said superlattice.

9. An optical oscillator as set forth in claim 8 wherein said superlattice includes alternating layers of a first semiconductor material and a second semiconductor material, said first material and said second material being selected so that a conduction band and a valence band across said layers form a quantum well in said first material and an X valley in said second material, said layers of said first material having a thickness selected such that an $n=1$ level in said quantum well has a higher energy than said X valley in the absence of said intermittent electric field and said constant electric field and a lower energy than said X valley in the presence of said intermittent electric field and said constant electric field.

10. An optical oscillator as set forth in claim 9 wherein said first material is indirect material and said second material is direct material.

11. An optical oscillator as set forth in claim 8 wherein each of said third electrode and said fourth electrode are of said second conductivity type.

12. An optical oscillator as set forth in claim 11 wherein said first conductivity type is p-type and said second conductivity type is n-type.

13. An optical oscillator as set forth in claim 8 wherein each of said first layer, said second layer, said third layer and said fourth layer is a lightly doped large band-gap semiconductor material.

14. An optical oscillator as set forth in claim 8 wherein each of said first electrode, said second electrode, said third electrode and said fourth electrode is a moderately doped large band-gap semiconductor material.

15. An optical oscillator comprising:
alternating layers of a direct semiconductor material and an indirect semiconductor material, said layers aggregately forming a top surface, a bottom surface, a first region and a second region;

means for injecting carriers into said first region of said layers;

means for applying a first voltage to develop an intermittent electric field between said top surface and said bottom surface at said first region of said layers, said indirect material in said first region becoming a direct material in the presence of said electric field;

means for developing a constant electric field between said top surface and said bottom surface at said second region of said layers to maintain said indirect material in said second region as a direct material; and means for developing an intermittent current through said second region of said layers wherein a total current equal to the sum of said intermittent current and an induced current caused by said intermittent electric field exhibits a hysteresis when said first voltage is substantially equal to a threshold voltage at which said indirect material becomes direct material, and further wherein said total current is maintained within said hysteresis.

16. An optical oscillator as set forth in claim 15 wherein each of said direct semiconductor material and said indirect semiconductor material is substantially intrinsic.

17. An optical oscillator as set forth in claim 15 wherein said injecting means includes:
a first semiconductor electrode of a first conductivity type;
a second semiconductor electrode of a second conductivity type, said alternating layers further having a first side and a second side opposite said first side, said first electrode being disposed adjacent said first side coextensively with said first region and said second electrode being disposed adjacent said second side coextensively with said first region; and
a voltage source electrically connected to said first electrode and said second electrode.

18. An optical oscillator as set forth in claim 17 wherein said first conductivity type is p-type and said second conductivity type is n-type.

19. An optical oscillator as set forth in claim 17 wherein each of said first electrode and said second electrode is a large band-gap moderately doped semiconductor material.

20. An optical oscillator as set forth in claim 15 wherein said applying means includes:
a first semiconductor layer of a first conductivity type disposed adjacent said top surface coextensively with said first region;
a second semiconductor layer of a second conductivity type opposite said first conductivity type disposed adjacent said bottom surface coextensively with said first region; and
a switched voltage source electrically connected to said first layer and said second layer.

21. An optical oscillator as set forth in claim 20 wherein each of said first layer and said second layer is a large band-gap lightly doped semiconductor material.

22. An optical oscillator as set forth in claim 20 wherein said first conductivity type is p-type and said second conductivity type is n-type.

23. An optical oscillator as set forth in claim 15 wherein said constant electric field developing means includes:
a first semiconductor layer of a first conductivity type disposed adjacent said top surface coextensively with said second region;
a second semiconductor layer of a second conductivity type opposite said first type disposed adjacent said bottom surface coextensively with said second region; and
a constant voltage source electrically connected to said first layer and said second layer.

24. An optical oscillator as set forth in claim 23 wherein each of said first layer and said second layer is a large band-gap lightly doped semiconductor material.

25. An optical oscillator as set forth in claim 23 wherein said first conductivity type is p-type and said second conductivity type is n-type.

26. An optical oscillator as set forth in claim 25 wherein said intermittent current developing means includes:
- a first semiconductor electrode of one of a first conductivity type and a second conductivity type;
- a second semiconductor electrode of a same conductivity type as said first electrode, said layers further having aggregately a first side and a second side opposite said first side, said first electrode being disposed adjacent said first side coextensively with said second region and said second electrode being disposed adjacent said second side coextensively with said second region; and
- a switched voltage source electrically connected to said first electrode and said second electrode.

27. An optical oscillator as set forth in claim 26 wherein said first conductivity type is p-type and said second conductivity type is n-type.

28. An optical oscillator as set forth in claim 27 wherein said first electrode and said second electrode are n-type.

29. An optical oscillator as set forth in claim 26 wherein each of said first electrode and said second electrode is a moderately doped large band-gap semiconductor material.

30. A bistable optical switch comprising:
- alternating layers of a direct semiconductor material and an indirect semiconductor material, said layers aggregately forming a top surface, a bottom surface, a first region and a second region;
- means for injecting carriers into said first region of said layers;
- means for applying a first voltage to develop an intermittent electric field between said top surface and said bottom surface at said first region of said layers, said indirect material in said first region becoming a direct material in the presence of said electric field;
- means for developing a constant electric field between said top surface and said bottom surface at said second region of said layers to maintain said indirect material in said second region as a direct material; and
- means for developing an intermittent current through said second region of said layers wherein a total current equal to the sum of said intermittent current and an induced current caused by said intermittent electric field exhibits a hysteresis when said first voltage is substantially equal to a threshold voltage at which said indirect material becomes direct material, and further wherein said total current is maintained outside and selectively at either side of said hysteresis.

31. An optical switch as set forth in claim 30 wherein each of said direct semiconductor material and said indirect semiconductor material is substantially intrinsic.

32. An optical switch as set forth in claim 30 wherein said injecting means includes:
- a first semiconductor electrode of a first conductivity type;
- a second semiconductor electrode of a second conductivity type, said alternating layers further having a first side and a second side opposite said first side, said first electrode being disposed adjacent said first side coextensively with said first region and said second electrode being disposed adjacent said second side coextensively with said first region; and
- a voltage source electrically connected to said first electrode and said second electrode.

33. An optical switch as set forth in claim 32 wherein said first conductivity type is p-type and said second conductivity type is n-type.

34. An optical switch as set forth in claim 32 wherein each of said first electrode and said second electrode is a large band-gap moderately doped semiconductor material.

35. An optical switch as set forth in claim 30 wherein said applying means includes:
- a first semiconductor layer of a first conductivity type disposed adjacent said top surface coextensively with said first region;
- a second semiconductor layer of a second conductivity type opposite said first conductivity type disposed adjacent said bottom surface coextensively with said first region; and
- a switched voltage source electrically connected to said first layer and said second layer.

36. An optical switch as set forth in claim 35 wherein each of said first layer and said second layer is a large band-gap lightly doped semiconductor material.

37. An optical switch as set forth in claim 35 wherein said first conductivity type is p-type and said second conductivity type is n-type.

38. An optical switch as set forth in claim 30 wherein said constant electric field developing means includes:
- a first semiconductor layer of a first conductivity type disposed adjacent said top surface coextensively with said second region;
- a second semiconductor layer of a second conductivity type opposite said first type disposed adjacent said bottom surface coextensively with said second region; and
- a constant voltage source electrically connected to said first layer and said second layer.

39. An optical switch as set forth in claim 38 wherein each of said first layer and said second layer is a large band-gap lightly doped semiconductor material.

40. An optical switch as set forth in claim 38 wherein said first conductivity type is p-type and said second conductivity type is n-type.

41. An optical switch as set forth in claim 30 wherein said intermittent current developing means includes:
- a first semiconductor electrode of one of a first conductivity type and a second conductivity type;
- a second semiconductor electrode of a same conductivity type as said first electrode, said layers further having aggregately a first side and a second side opposite said first side, said first electrode being disposed adjacent said first side coextensively with said second region and said second electrode being disposed adjacent said second side coextensively with said second region; and
- a switched voltage source electrically connected to said first electrode and said second electrode.

42. An optical switch as set forth in claim 41 wherein said first conductivity type is p-type and said second conductivity type is n-type.

43. An optical switch as set forth in claim 42 wherein said first electrode and said second electrode are n-type.

44. An optical switch as set forth in claim 41 wherein each of said first electrode and said second electrode is a moderately doped large band-gap semiconductor material.

* * * * *